(12) United States Patent
Chuang

(10) Patent No.: US 10,068,861 B2
(45) Date of Patent: Sep. 4, 2018

(54) SEMICONDUCTOR DEVICE

(71) Applicant: ChipMOS Technologies Inc., Hsinchu (TW)

(72) Inventor: Kun-Shu Chuang, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 28 days.

(21) Appl. No.: 15/281,095

(22) Filed: Sep. 30, 2016

(65) Prior Publication Data

US 2017/0352631 A1    Dec. 7, 2017

(30) Foreign Application Priority Data

Jun. 7, 2016  (TW) .............................. 105117997 A

(51) Int. Cl.
*H01L 23/00*  (2006.01)
*H01L 23/498*  (2006.01)

(52) U.S. Cl.
CPC ............ *H01L 24/02* (2013.01); *H01L 23/498* (2013.01); *H01L 23/49811* (2013.01); *H01L 23/49838* (2013.01); *H01L 23/49894* (2013.01); *H01L 24/17* (2013.01); *H01L 2224/0233* (2013.01); *H01L 2224/0236* (2013.01); *H01L 2224/02373* (2013.01); *H01L 2224/1412* (2013.01)

(58) Field of Classification Search
CPC ......... H01L 23/49805; H01L 23/49827; H01L 23/49833; H01L 23/5226; H01L 23/53228; H01L 23/53209; H01L 23/53266; H01L 2224/13014; H01L 2224/0133; H01L 2224/3185; H01L 2224/13147; H01L 2224/11462; H01L 2224/13083; H01L 2224/13026; H01L 2224/11019; H01L 2224/13551; H01L 2224/13155; H01L 2224/13017
See application file for complete search history.

(56) References Cited

U.S. PATENT DOCUMENTS

2014/0061900 A1    3/2014  Park et al.

FOREIGN PATENT DOCUMENTS

| CN | 103295997 | 9/2013 |
|---|---|---|
| TW | 200802646 | 1/2008 |
| TW | 200820406 | 5/2008 |
| TW | I297205 | 5/2008 |
| TW | 201515125 | 4/2015 |

OTHER PUBLICATIONS

"Office Action of Taiwan Counterpart Application," dated Jan. 24, 2017, p. 1-p. 6.

*Primary Examiner* — (Vikki) Hoa B Trinh
(74) *Attorney, Agent, or Firm* — JCIPRNET

(57) ABSTRACT

Provided is a semiconductor device including a substrate, a pad, a protective layer, a plurality of convex patterns, a redistribution layer (RDL), and a bump. The pad is disposed on the substrate. The protective layer is disposed on the substrate. The protective layer has a first opening exposing a portion of a surface of the pad. The convex patterns are disposed on the protective layer. The RDL is disposed on the convex patterns. The RDL extends from the pad to the convex patterns. The bump is disposed on the convex patterns.

18 Claims, 7 Drawing Sheets

SEMICONDUCTOR DEVICE

CROSS-REFERENCE TO RELATED APPLICATION

This application claims the priority benefit of Taiwan application serial no. 105117997, filed on Jun. 7, 2016. The entirety of the above-mentioned patent application is hereby incorporated by reference herein and made a part of this specification.

BACKGROUND OF THE INVENTION

Field of the Invention

The invention relates to an integrated circuit, and particularly relates to a semiconductor device.

Description of Related Art

With the development of technology, increasing degree of integration of semiconductor devices and reducing critical dimensions have gradually become a trend. In this trend, technique of wafer level package structures which provides a sufficient surface region to bear more input/output (I/O) is generated accordingly. Additionally, a redistribution layer (RDL) can also be formed on a semiconductor chip, so as to redistribute pads on the semiconductor chip to any position.

In general, metal copper is mostly used as a main material of the RDL. The metal copper not only has good electrical conductivity and thermal conductivity, but also has good extensibility. Relatively, the metal copper is easy to expand after heating. Particularly, when the metal copper is used in a larger area (e.g., the pad or the RDL), the phenomenon of expansion of the metal copper is more obvious, which may easily cause the phenomenon of peeling, de-lamination, or crack between the RDL and a protective layer thereunder, thereby reducing the reliability.

SUMMARY OF THE INVENTION

The invention provides a semiconductor device having convex patterns, which can reduce the phenomenon of peeling, de-lamination, or crack between the RDL and the protective layer thereunder, thereby improving the reliability.

The invention provides a semiconductor device including a substrate, a pad, a protective layer, a plurality of convex patterns, an RDL, and a bump. The pad is disposed on the substrate. The protective layer is disposed on the substrate. The protective layer has a first opening exposing a portion of a surface of the pad. The convex patterns are disposed on the protective layer. The RDL is disposed on the convex patterns. The RDL extends from the pad to the convex patterns. The bump is disposed on the convex patterns.

According to an embodiment of the invention, the RDL has an uneven surface. The uneven surface corresponds to the convex patterns.

According to an embodiment of the invention, the RDL is in direct contact with the pad.

According to an embodiment of the invention, the semiconductor device further includes an insulating layer and an under-bump metal layer. The insulating layer is disposed on the RDL. The insulating layer has a second opening. The second opening exposes a surface of the RDL and corresponds to the convex patterns. The under-bump metal layer covers at least a surface of the second opening, and is disposed between the bump and the RDL.

According to an embodiment of the invention, the semiconductor device further includes a cap layer disposed on the bump.

According to an embodiment of the invention, a top surface of the bump has an uneven surface. The uneven surface corresponds to the convex patterns.

According to an embodiment of the invention, the semiconductor device further includes a dielectric layer disposed between the convex patterns and the protective layer.

According to an embodiment of the invention, a shape of each the convex patterns includes a block shape, a bar shape, a ring shape, or a combination thereof.

According to an embodiment of the invention, a height of the bump is 4 to 14 times a height of each of the convex patterns.

The invention also provides a semiconductor device including a substrate, a pad, a protective layer, a patterned dielectric layer, an RDL, and a bump. The pad is disposed on the substrate. The protective layer is disposed on the substrate. The protective layer has a first opening. The first opening exposes a portion of a surface of the pad. The patterned dielectric layer is disposed on the protective layer. The patterned dielectric layer includes a main body part and a plurality of convex patterns disposed on the main body part or in the main body part. The RDL is disposed on the patterned dielectric layer. The RDL extends from the pad to the convex patterns. The bump is disposed on the convex patterns.

According to an embodiment of the invention, the semiconductor device further includes an insulating layer and an under-bump metal layer. The insulating layer is disposed on the RDL. The insulating layer has a second opening. The second opening exposes a surface of the RDL and corresponds to the convex patterns. The under-bump metal layer covers at least a surface of the second opening, and is disposed between the bump and the RDL.

According to an embodiment of the invention, the RDL has an uneven surface. The uneven surface corresponds to the convex patterns.

According to an embodiment of the invention, the redistribution layer is in direct contact with the pad.

According to an embodiment of the invention, the semiconductor device further comprises a cap layer disposed on the bump.

According to an embodiment of the invention, a top surface of the bump has an uneven surface, and the uneven surface corresponds to the convex patterns.

According to an embodiment of the invention, a shape of each the convex patterns comprises a block shape, a bar shape, a ring shape, or a combination thereof.

According to an embodiment of the invention, a height of the bump is 4 to 14 times a height of each of the convex patterns.

The invention also provides a semiconductor device including a substrate, a pad, a protective layer, a patterned dielectric layer, an RDL, and a bump. The pad is disposed on the substrate. The protective layer is disposed on the substrate. The protective layer has a first opening. A portion of a surface of the pad is exposed by the first opening. The patterned dielectric layer is disposed on the protective layer. The patterned dielectric layer has a plurality of recesses, a surface of the protective layer is exposed by the recesses. The RDL is disposed on the patterned dielectric layer. The RDL extends from the pad to the recesses. The bump is disposed on the recesses.

According to an embodiment of the invention, the semiconductor device further includes an insulating layer and an under-bump metal layer. The insulating layer is disposed on the RDL. The insulating layer has a second opening. The second opening exposes a surface of the RDL and corresponds to the recesses. The under-bump metal layer covers at least a surface of the second opening, and is disposed between the bump and the RDL.

According to an embodiment of the invention, the RDL has an uneven surface. The uneven surface corresponds to the recesses.

Based on the above, by forming the convex patterns composed of dielectric materials under the bump in the invention, the metal layer (may be the RDL or the under-bump metal layer, for example) between the bump and the convex patterns has the uneven surface. Thus, compared to the conventional flat surface, the embodiment can improve stress release of the metal layer and reduce transverse thermal expansion effects. That is, the embodiment can reduce the phenomenon of peeling, de-lamination, or crack between the metal layer and the protective layer thereunder, thereby improving the reliability.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
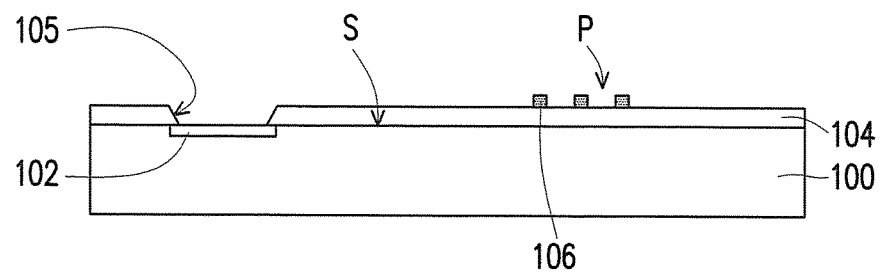
FIG. 1A to FIG. 1F are schematic cross-sectional diagrams of a manufacturing process of a semiconductor device according to a first embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

FIG. 1A to FIG. 1F are schematic cross-sectional diagrams of a manufacturing process of a semiconductor device according to a first embodiment of the invention. FIG. 2A to FIG. 2B are schematic top views of a portion of FIG. 1A respectively.

Figure 2A:
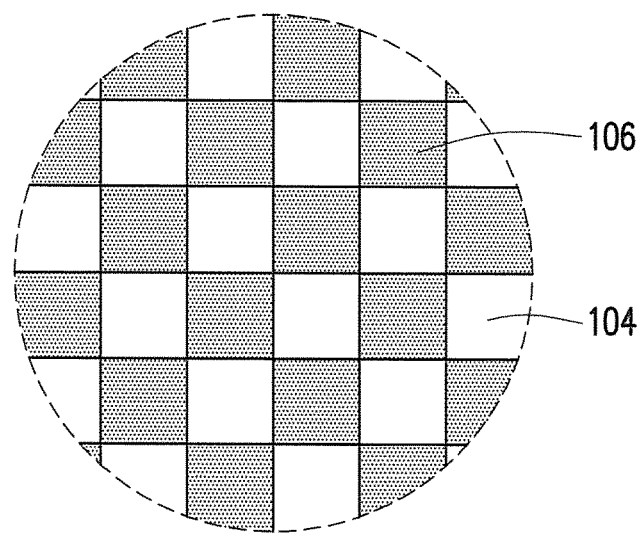
FIG. 2A to FIG. 2B are schematic top views of a portion of FIG. 1A respectively.
Figure 2B:
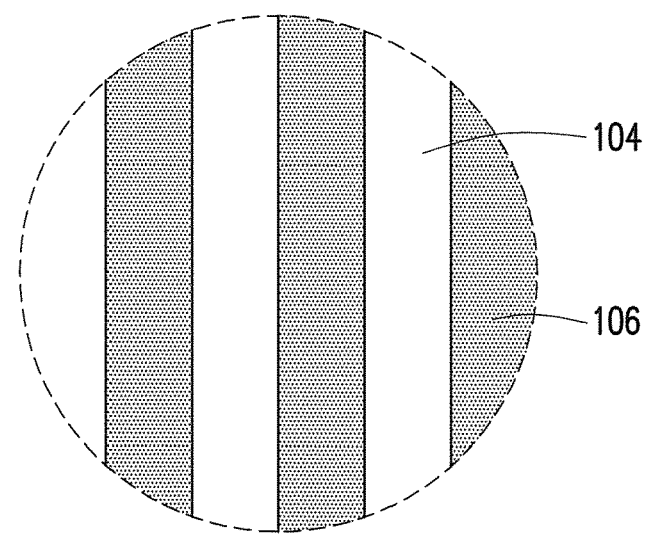

Referring to FIG. 1A, the invention provides the manufacturing process of a semiconductor device 10 of the first embodiment including the following steps. First, a substrate 100 is provided. A material of the substrate 100 may be at least one material selected from the group consisting of Si, Ge, SiGe, GaP, GaAs, SiC, SiGeC, InAs, and InP, for example. The substrate 100 may also be a silicon-on-insulator (SOI) substrate.

Then, a pad 102 is formed on an active surface S of the substrate 100. In an embodiment, a material of the pad 102 includes a metal material. The metal material may be copper, aluminum, gold, silver, nickel, palladium, or a combination thereof, for example. A method of forming a pad 102 may be physical vapor deposition, for example.

Thereafter, a protective layer 104 is formed on the substrate 100. The protective layer 104 has a first opening 105. The first opening 105 exposes a portion of a surface of the pad 102. In an embodiment, a material of the protective layer 104 may be silicon oxide, silicon nitride, phosphosilicate glass (PSG), or a combination thereof, for example. A method of forming the protective layer 104 may be that, a protective material layer is attached on the substrate 100 by screen printing, coating, or in a dry-film type directly, for example. Then, a lithography and etching process is performed on the protective material layer, so as to pattern the protective material layer.

After that, a plurality of convex patterns 106 are formed on the protective layer 104. As shown in FIG. 1A, the convex patterns 106 are disposed on the protective layer 104 outside of the pad 102. In an embodiment, a material of the convex patterns 106 includes a dielectric material. The dielectric material may be polyimide (PI), polybezoxazole (PBO), benzocyclobutene (BCB), or a combination thereof, for example. A method of forming the convex patterns 106 may be that, a convex pattern material layer is formed on the substrate 100 by coating or chemical vapor deposition, for example. Then, a lithography and etching process is performed on the convex pattern material layer (not shown), so as to pattern the convex pattern material layer.

It should be mentioned that, from the top view of a portion P of FIG. 1A, a shape of a single convex pattern 106 may be a block shape (as shown in FIG. 2A), a bar shape (as shown in FIG. 2B), a ring shape (not shown), or a combination thereof, for example. A plurality of convex patterns 106 and the protective layer 104 may form a grid pattern (as shown in FIG. 2A), a grating pattern (as shown in FIG. 2B), a concentric circular pattern (not shown), or a combination thereof. However, the invention is not limited thereto. As long as the convex patterns 106 protrude from a vertical direction of a surface of the protective layer 104, the shape of the single convex pattern 106 and the pattern composed of the convex patterns 106 and the protective layer 104 are not limited.

Figure 1B:
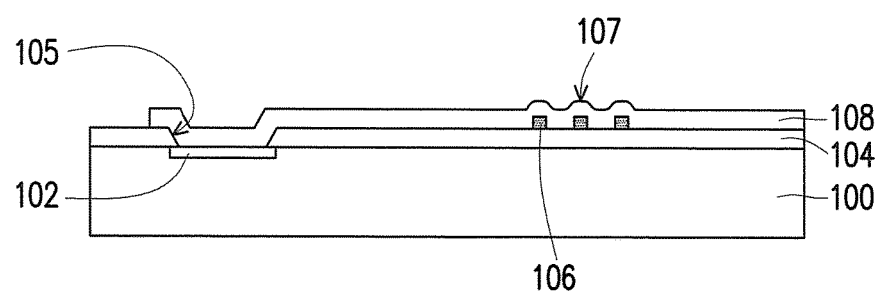

Referring to FIG. 1B, a redistribution layer (RDL) 108 is formed on the convex patterns 106. The RDL 108 extends from the pad 102 to the convex patterns 106. Also, the RDL 108 is in direct contact with the pad 102, so as to redistribute the pad 102 to any position, thereby complying with the needs of a user or a client. On the other hand, the RDL 108 covers the surface of the protective layer 104, a surface of the convex patterns 106, and a surface of the pad 102. Since the RDL 108 covers the surface of the convex patterns 106, the RDL 108 also has an uneven surface 107 corresponding to the convex patterns 106. Herein, the "corresponding to" means that the uneven surface 107 is located on the convex patterns 106, and is not repeated in the following related content. In an embodiment, a material of the RDL 108 includes a metal material. The metal material may be copper or other metal materials having good electrical conductivity, thermal conductivity, and extensibility, for example. A method of forming the RDL 108 may be physical vapor deposition, for example.

It should be mentioned that, since the RDL 108 corresponding to the convex patterns 106 has the uneven surface 107, the embodiment can improve stress release of the RDL 108 and reduce transverse thermal expansion effects compared to the flat surface. That is, the embodiment can reduce the phenomenon of peeling, de-lamination, or crack between the RDL 108 and the protective layer 104 thereunder, thereby improving the reliability.

Figure 1C:
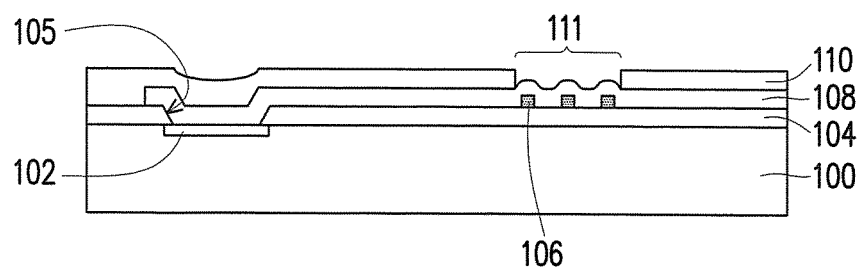

Referring to FIG. 1C, an insulating layer 110 is formed on the RDL 108. The insulating layer 110 has a second opening 111. The second opening 111 exposes a surface of the RDL 108 and corresponds to the convex patterns 106. In an embodiment, a material of the insulating layer 110 includes a dielectric material. The dielectric material may be PI, silicon oxide, silicon nitride, or a combination thereof, for example. A method of forming the insulating layer 110 may be chemical vapor deposition, for example.

Figure 1D:
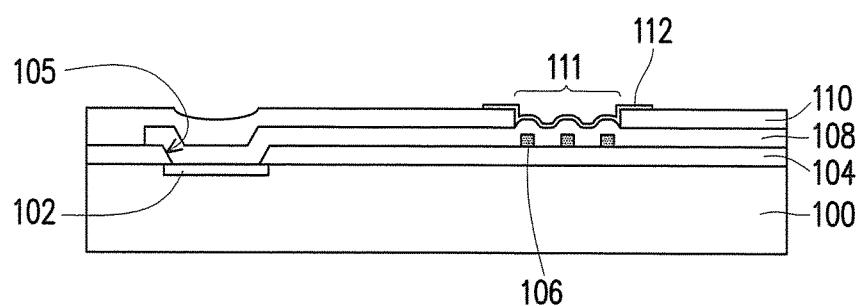

Referring to FIG. 1D, an under-bump metal layer 112 is formed on the convex patterns 106. The under-bump metal layer 112 not only covers a surface of the second opening 111, but also extends to a portion of a surface of the insulating layer 110. The under-bump metal layer 112 shown in FIG. 1D is a single-layer structure, but the invention is not limited thereto. In other embodiments, the under-bump metal layer 112 may also be a double-layer structure or a multi-layer structure, for example. In an embodiment, the under-bump metal layer 112 may be a nickel layer, a titanium layer, a titanium-tungsten layer, a palladium layer, a gold layer, a silver layer, or any layer structure of a combination thereof, for example. A method of forming the under-bump metal layer 112 may be physical vapor deposition, for example.

Figure 1E:
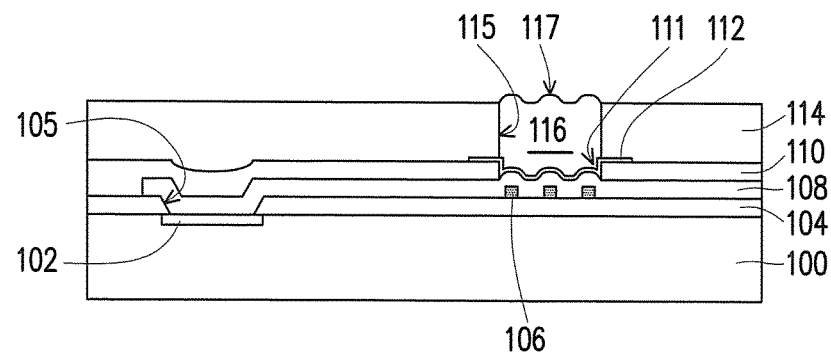

Referring to FIG. 1E, a patterned photoresist layer 114 is formed on the insulating layer 110. The patterned photoresist layer 114 has a third opening 115. The third opening 115 exposes a surface of the under-bump metal layer 112 and corresponds to the convex patterns 106. In an embodiment, a material of the patterned photoresist layer 114 may be a positive photoresist or a negative photoresist, for example, and a forming method thereof may be a spin-coating method, for example.

Then, a bump 116 is formed in the second opening 111 and the third opening 115. Since the bump 116 corresponds to the convex patterns 106, the bump 116 also has an uneven surface 117 corresponding to the convex patterns 106. In an embodiment, a material of the bump 116 includes a metal material. The metal material may be gold, copper or other metal materials having good electrical conductivity, thermal conductivity, and extensibility, for example. A method of forming the bump 116 may be electroplating, electroless plating, or other suitable methods, for example. The uneven surface 117 of the bump 116 and a top surface of the patterned photoresist layer 114 shown in FIG. 1E are substantially coplanar, but the invention is not limited thereto. In other embodiments, the uneven surface 117 of the bump 116 may be higher or lower than the top surface of the patterned photoresist layer 114.

Figure 1F:
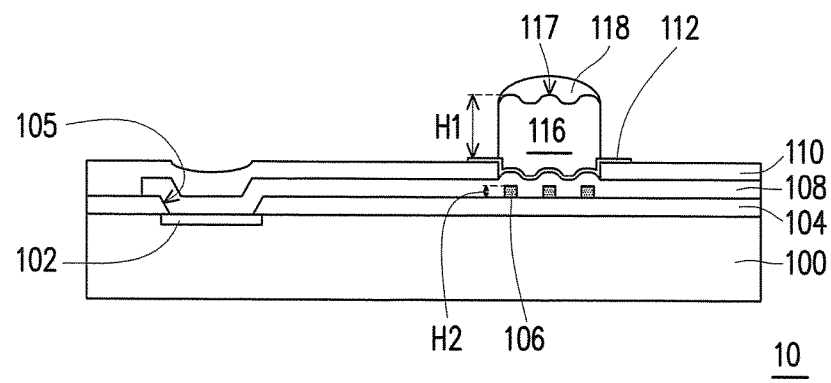

Referring to FIG. 1F, a cap layer 118 is formed on the uneven surface 117 of the bump 116. Then, the patterned photoresist layer 114 is removed, and a reflow is heated. A material of the cap layer 118 may be tin, an alloy of tin and silver, and an alloy of gold and tin, for example, and a melting point thereof is less than a melting point of the bump 116. Thus, it is suitable for bonding to other carriers. In an embodiment, a height H1 of the bump 116 is 4 to 14 times a height H2 of the convex patterns. However, the invention is not limited thereto.

Figure 3:
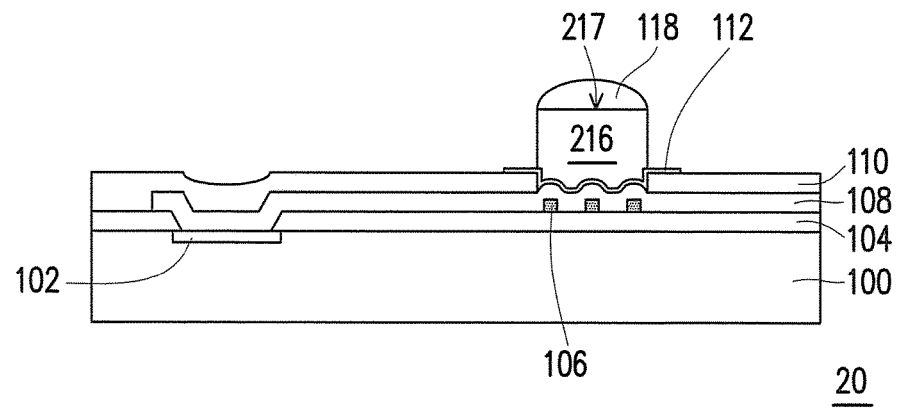
FIG. 3 is schematic cross-sectional diagram of a semiconductor device according to a second embodiment of the invention.

FIG. 3 is schematic cross-sectional diagram of a semiconductor device according to a second embodiment of the invention.

Referring to FIG. 3, basically, a semiconductor device 20 of the second embodiment is similar to the semiconductor device 10 of the first embodiment. The difference between the two is that, a bump 216 of the semiconductor device 20 of the second embodiment has a flat surface 217. A method of forming the flat surface 217 may be that, after forming the bump 216, a grinding method is further used to planarize a surface of the bump 216.

Figure 4:
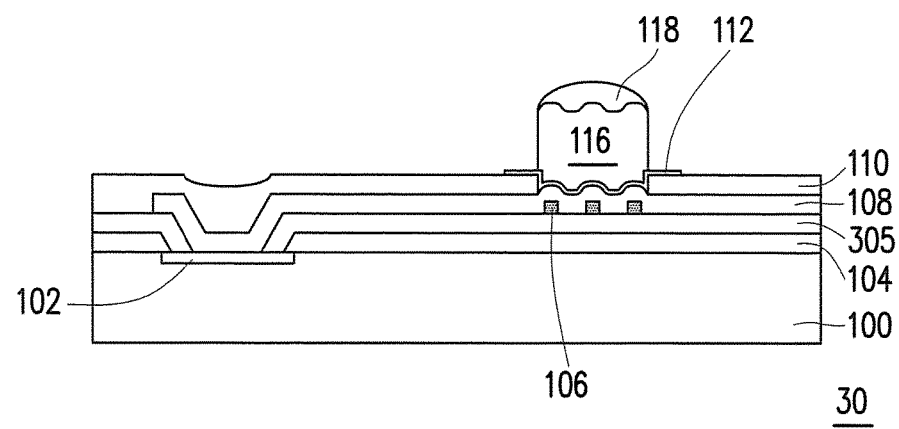
FIG. 4 is schematic cross-sectional diagram of a semiconductor device according to a third embodiment of the invention.

FIG. 4 is schematic cross-sectional diagram of a semiconductor device according to a third embodiment of the invention.

Referring to FIG. 4, basically, a semiconductor device 30 of the third embodiment is similar to the semiconductor device 10 of the first embodiment. The difference between the two is that, the semiconductor device 30 of the third embodiment further includes a dielectric layer 305 disposed between the convex patterns 106 and the protective layer 104. In an embodiment, a material of the dielectric layer 305 is the same or different from the material of the convex patterns 106. For example, both the convex patterns 106 and the dielectric layer 305 may be PI. On the other hand, the dielectric layer 305 may be silicon oxide, and the convex patterns 106 may be PI.

Figure 5:
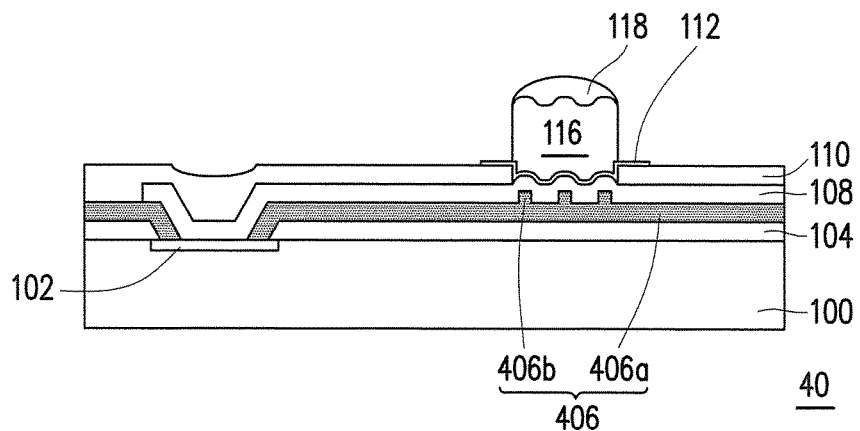
FIG. 5 is schematic cross-sectional diagram of a semiconductor device according to a fourth embodiment of the invention.

FIG. 5 is schematic cross-sectional diagram of a semiconductor device according to a fourth embodiment of the invention.

Referring to FIG. 5, basically, a semiconductor device 40 of the fourth embodiment is similar to the semiconductor device 30 of the third embodiment. The difference between the two is that, the semiconductor device 40 of the fourth embodiment has a patterned dielectric layer 406 disposed between the protective layer 104 and the RDL 108. In particular, the patterned dielectric layer 406 includes a main body part 406a and a plurality of convex patterns 406b disposed on the main body part 406a. In an embodiment, a material of the patterned dielectric layer 406 includes a dielectric material. The dielectric material may be PI, PBO, BCB, or a combination thereof, for example. A method of forming the patterned dielectric layer 406 may be that, a dielectric material layer (not shown) is formed on the protective layer 104 by coating or chemical vapor deposition, for example. Thereafter, a patterned mask layer (not shown) is formed on the dielectric material layer, wherein the patterned mask layer only covers or protects on the regions of the dielectric material layer corresponding to the convex patterns 406b. Then, the patterned mask layer is used as a mask, and an etching process is performed on the dielectric material layer to remove the dielectric material layer not covered or protected by the patterned mask layer, so as to pattern the dielectric material layer. It should be mentioned that, when the etching process is performed, etching parameters can be controlled, such that the surface of the protective layer 104 under the patterned dielectric layer 406 is not exposed. Additionally, in the embodiment, another lithography and etching process may be further performed to remove the patterned dielectric layer 406 on the pad 102.

Figure 6A:
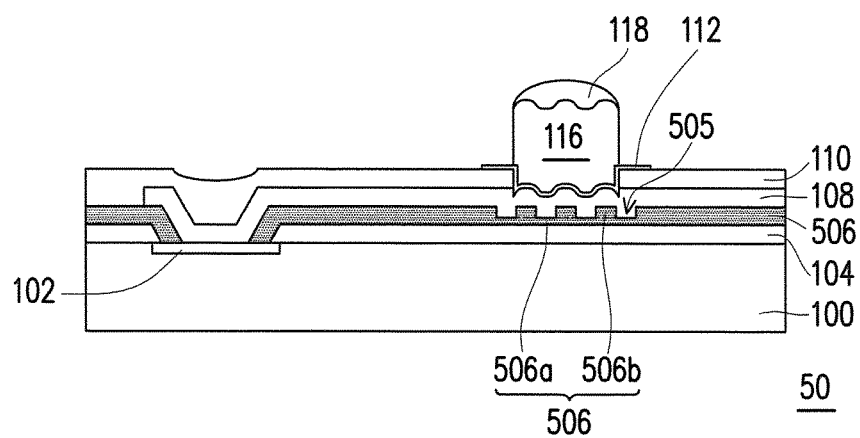
FIG. 6A is schematic cross-sectional diagram of a semiconductor device according to a fifth embodiment of the invention.
Figure 6B:
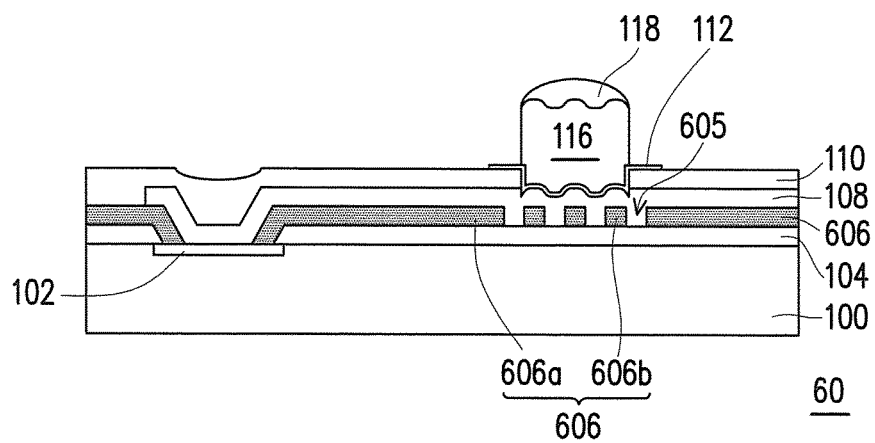
FIG. 6B is schematic cross-sectional diagram of a semiconductor device according to a sixth embodiment of the invention.

FIG. 6A is schematic cross-sectional diagram of a semiconductor device according to a fifth embodiment of the invention. FIG. 6B is schematic cross-sectional diagram of a semiconductor device according to a sixth embodiment of the invention.

Referring to FIG. 6A, basically, a semiconductor device 50 of the fifth embodiment is similar to the semiconductor device 40 of the fourth embodiment. The difference between the two is that, a main body part 506a of a patterned dielectric layer 506 of the fifth embodiment has a plurality of recesses 505 thereon, such that a plurality of convex patterns 506b are formed on the main body part 506a between the recesses 505. Since surfaces of the recesses 505 and the convex patterns 506b form an uneven surface, the RDL 108 corresponding to the recesses 505 and the convex patterns 506b thereon also has an uneven surface. The uneven surface can improve stress release of the RDL 108 and reduce transverse thermal expansion effects, thereby improving the reliability.

In an embodiment, the recesses 505 may expose a surface of a portion of the main body part 506a (as shown in FIG. 6A). In another embodiment, recesses 605 may also penetrate a patterned dielectric layer 606, so as to expose a surface of the protective layer 104 thereunder (as shown in FIG. 6B). That is, convex patterns 606b of a semiconductor device 60 of the sixth embodiment are disposed in a main body part 606a, and the main body part 606a encloses and surrounds the convex patterns 606b. Since surfaces of the recesses 605 and the convex patterns 606b form an uneven surface, the RDL 108 corresponding to the recesses 605 and the convex patterns 606b thereon also has an uneven surface.

In an embodiment, a material and a forming method of the patterned dielectric layers 506 and 606 are similar to the material and the forming method of the patterned dielectric layer 406, wherein the difference between the forming methods is that, when a patterned mask layer (not shown) is formed on the dielectric material layer, the patterned mask layers of the fifth embodiment and the sixth embodiment cover or protect on the regions of the dielectric material layer outside of the corresponding recesses 505 and 605. Thus, after the etching process is performed, the regions of the dielectric material layer corresponding to the recesses 505 and 605 are removed, so as to form the patterned dielectric layer 506 having a plurality of the recesses 505 or the patterned dielectric layer 606 having a plurality of the recesses 605.

In summary, by forming the convex patterns composed of dielectric materials under the bump in the invention, the metal layer (may be the RDL or the under-bump metal layer, for example) between the bump and the convex patterns has the uneven surface. Thus, compared to the conventional flat surface, the embodiment can improve stress release of the metal layer and reduce transverse thermal expansion effects. That is, the embodiment can reduce the phenomenon of peeling, de-lamination, or crack between the metal layer and the protective layer thereunder, thereby improving the reliability.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
    a pad, disposed on a substrate;
    a protective layer, disposed on the substrate, the protective layer having a first opening, the first opening exposing a portion of a surface of the pad;
    a plurality of convex patterns, disposed on the protective layer;
    a redistribution layer, disposed on the convex patterns, wherein the redistribution layer extends from the pad to the convex patterns;
    a bump, disposed on the convex patterns; and
    a cap layer, disposed on the bump.

2. The semiconductor device according to claim 1, wherein the redistribution layer has an uneven surface, and the uneven surface corresponds to the convex patterns.

3. The semiconductor device according to claim 1, wherein the redistribution layer is in direct contact with the pad.

4. The semiconductor device according to claim 1, further comprising:
    an insulating layer, disposed on the redistribution layer, wherein the insulating layer has a second opening, the second opening exposing a surface of the redistribution layer and corresponding to the convex patterns; and
    an under-bump metal layer, covering at least a surface of the second opening, and disposed between the bump and the redistribution layer.

5. The semiconductor device according to claim 1, wherein a top surface of the bump has an uneven surface, and the uneven surface corresponds to the convex patterns.

6. The semiconductor device according to claim 1, further comprising a dielectric layer disposed between the convex patterns and the protective layer.

7. The semiconductor device according to claim 1, wherein a shape of each the convex patterns comprises a block shape, a bar shape, a ring shape, or a combination thereof.

8. The semiconductor device according to claim 1, wherein a height of the bump is 4 to 14 times a height of each of the convex patterns.

9. A semiconductor device, comprising:
    a pad, disposed on a substrate;
    a protective layer, disposed on the substrate, the protective layer having a first opening, the first opening exposing a portion of a surface of the pad;
    a patterned dielectric layer, disposed on the protective layer, wherein the patterned dielectric layer comprises a main body part and a plurality of convex patterns disposed on the main body part or in the main body part;
    a redistribution layer, disposed on the patterned dielectric layer, wherein the redistribution layer extends from the pad to the convex patterns;
    a bump, disposed on the convex patterns; and
    a cap layer, disposed on the bump.

10. The semiconductor device according to claim 9, further comprising:
    an insulating layer, disposed on the redistribution layer, wherein the insulating layer has a second opening, the second opening exposing a surface of the redistribution layer and corresponding to the convex patterns; and
    an under-bump metal layer, covering at least a surface of the second opening, and disposed between the bump and the redistribution layer.

11. The semiconductor device according to claim 9, wherein the redistribution layer has an uneven surface, and the uneven surface corresponds to the convex patterns.

12. The semiconductor device according to claim 9, wherein the redistribution layer is in direct contact with the pad.

13. The semiconductor device according to claim 9, wherein a top surface of the bump has an uneven surface, and the uneven surface corresponds to the convex patterns.

14. The semiconductor device according to claim 9, wherein a shape of each the convex patterns comprises a block shape, a bar shape, a ring shape, or a combination thereof.

15. The semiconductor device according to claim 9, wherein a height of the bump is 4 to 14 times a height of each of the convex patterns.

16. A semiconductor device, comprising:
a pad, disposed on a substrate;
a protective layer, disposed on the substrate, the protective layer having a first opening, a portion of a surface of the pad exposed by the first opening;
a patterned dielectric layer, disposed on the protective layer, wherein the patterned dielectric layer has a plurality of recesses, a surface of the protective layer is exposed by the recesses;
a redistribution layer, disposed on the patterned dielectric layer, wherein the redistribution layer extends from the pad to the recesses;
a bump, disposed on the recesses; and
a cap layer, disposed on the bump.

17. The semiconductor device according to claim 16, further comprising:
an insulating layer, disposed on the redistribution layer, wherein the insulating layer has a second opening, the second opening exposing a surface of the redistribution layer and corresponding to the recesses; and
an under-bump metal layer, covering at least a surface of the second opening, and disposed between the bump and the redistribution layer.

18. The semiconductor device according to claim 16, wherein the redistribution layer has an uneven surface, and the uneven surface corresponds to the recesses.

\* \* \* \* \*